US012652854B2

(12) United States Patent
Takagiwa et al.

(10) Patent No.: US 12,652,854 B2

(45) Date of Patent: Jun. 9, 2026

(54) SEMICONDUCTOR DEVICE AND ELECTRONIC APPARATUS

(71) Applicant: Rohm Co., Ltd., Kyoto (JP)

(72) Inventors: Shuhei Takagiwa, Kyoto (JP); Hiroshi Furutani, Kyoto (JP); Takeshi Seike, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 749 days.

(21) Appl. No.: 17/928,373

(22) PCT Filed: May 19, 2021

(86) PCT No.: PCT/JP2021/018899

§ 371 (c)(1),
(2) Date: Nov. 29, 2022

(87) PCT Pub. No.: WO2021/251081

PCT Pub. Date: Dec. 16, 2021

(65) Prior Publication Data

US 2023/0223403 A1 Jul. 13, 2023

(30) Foreign Application Priority Data

Jun. 8, 2020 (JP) ................................. 2020-099164

(51) Int. Cl.
H10D 84/60 (2025.01)
H10W 20/41 (2026.01)
(Continued)

(52) U.S. Cl.
CPC ........ H10D 84/645 (2025.01); H10W 20/427 (2026.01); H10W 72/5449 (2026.01); H10W 72/9445 (2026.01); H10W 90/751 (2026.01)

(58) Field of Classification Search
CPC ...................................................... H10D 10/60
See application file for complete search history.

(56) References Cited

U.S. PATENT DOCUMENTS

2019/0103551 A1* 4/2019 Cesaretti ................ H10N 52/00

FOREIGN PATENT DOCUMENTS

JP 2002-246553 8/2002
JP 2006-193019 7/2006
(Continued)

OTHER PUBLICATIONS

JP OA—Japanese Patent Office, Office Action in Japanese Appln. No. 2022-530087, dated May 13, 2025, 10 pages (with machine translation).
(Continued)

*Primary Examiner* — Yu-Hsi D Sun

(74) *Attorney, Agent, or Firm* — Fish & Richardson P.C.

(57) ABSTRACT

For example, a semiconductor device includes one or more first subcontacts electrically conducted to a substrate. At least one of the one or more first subcontacts is formed in an element arrangement region, and has a lower impedance than the substrate. Preferably, at least one of the one or more first subcontacts is adjacent to a circuit element formed in the element arrangement region. Preferably, on the substrate, which is of a first conductivity type, an epilayer of a second conductivity type is formed, and the one or more first subcontacts include a first line having a lower impedance than the substrate, and a semiconductor region of the first conductivity type penetrating through the epilayer to electrically conduct the first line and the substrate to each other.

20 Claims, 14 Drawing Sheets

(51) Int. Cl.
| | | |
|---|---|---|
| *H10W 72/50* | (2026.01) | |
| *H10W 72/90* | (2026.01) | |
| *H10W 90/00* | (2026.01) | |

(56) References Cited

FOREIGN PATENT DOCUMENTS

| JP | 2008-193019 | 8/2008 |
|---|---|---|
| JP | 2012-009841 | 1/2012 |
| JP | 2013-033917 | 2/2013 |

OTHER PUBLICATIONS

International Search Report in International Appln. No. PCT/JP2021/018899, dated Aug. 3, 2021, 7 pages.

* cited by examiner

<u>100</u>

SEMICONDUCTOR DEVICE AND ELECTRONIC APPARATUS

TECHNICAL FIELD

The invention disclosed herein relates to a semiconductor device and an electronic apparatus using the same.

BACKGROUND ART

In recent years, there has been a growing demand for improvement of noise characteristics of semiconductor devices to be incorporated in various applications (including not only household appliances but also industrial and in-vehicle apparatuses).

An example of conventional technology related to what has just been mentioned is disclosed in Patent Document 1 identified below.

CITATION LIST

Patent Literature

Patent Document 1: Japanese unexamined patent application publication No. 2013-33917

SUMMARY OF INVENTION

Technical Problem

However, conventional semiconductor devices still have a lot to improve in terms of their noise characteristics (in particular, their electromagnetic susceptibility).

An object of the invention disclosed herein is, in view of the above-described problem found by the inventors of the present invention, to provide a semiconductor device having excellent noise characteristics and an electronic apparatus using the same.

Solution to Problem

For instance, a semiconductor device disclosed herein includes one or more first subcontacts electrically conducted to a substrate, and at least one of the first subcontacts is formed in an element arrangement region on the substrate, and is configured to have a lower impedance than the substrate.

Other characteristics, elements, steps, advantages, and features will emerge from the following descriptions of embodiments of the invention and the attached drawings relating thereto.

Advantageous Effects of Invention

According to the invention disclosed herein, it is possible to provide a semiconductor device having excellent noise characteristics and an electronic apparatus using the same.

DESCRIPTION OF EMBODIMENTS

Semiconductor Device (Comparative Example)

First, before describing semiconductor devices according to new embodiments, a brief description will be given of a comparative example to be compared with the new embodiments.

Figure 1:
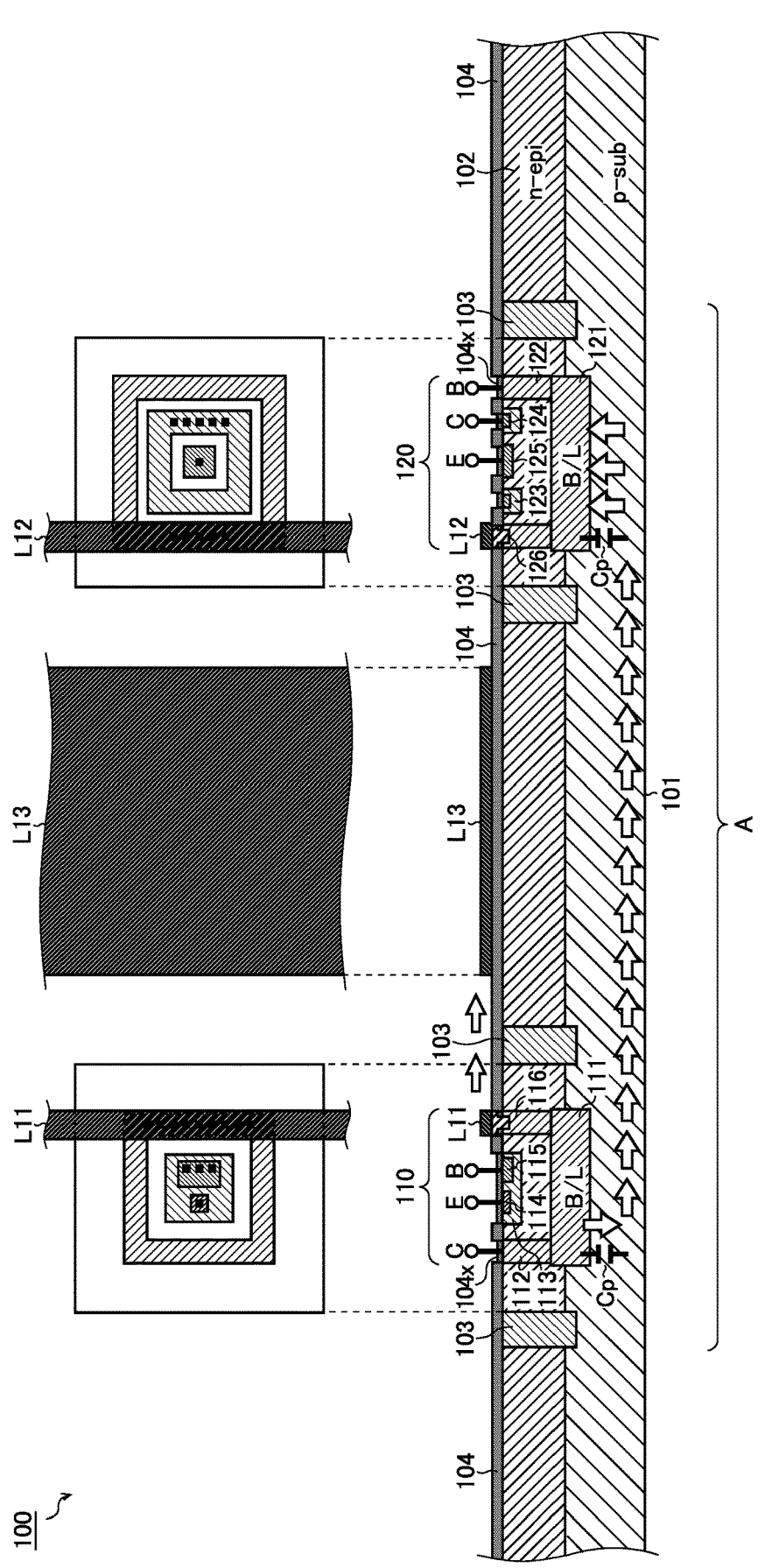
FIG. 1 is a diagram showing a semiconductor device according to a comparative example.

FIG. 1 is a diagram (of which the upper part is a plan view and the lower part is a vertical sectional view) showing a semiconductor device according to a comparative example. In a semiconductor device 100 according to this comparative example, on a surface of a p-type substrate 101, an n-type epilayer (epitaxial layer) 102 is formed which has a same crystal plane as the p-type substrate 101. In an element arrangement region A on the p-type substrate 101, a plurality of circuit elements (in this figure, only an npn-type bipolar transistor 110 and a pnp-type bipolar transistor 120 are illustrated as examples), and the circuit elements are electrically isolated from each other by a p-type element isolation portion 103. On a surface of the n-type epilayer 102, insulating layers 104 and 104x are provided. In particular, the insulating layer 104x which covers an opening portion of a circuit element (the opening portion being a region where a conductive member can be formed for electrical conductivity between the circuit element and a wiring layer) is thinner than the insulating layer 104 which covers portions other than the opening portion.

The transistor 110 is formed of an n-type semiconductor region 111, an N-type semiconductor region 112, a p-type semiconductor region 113, an n-type semiconductor region 114, a p-type semiconductor region 115, and a conductive member 116.

The n-type semiconductor region 111 is embedded at a boundary surface between the p-type substrate 101 and the n-type epilayer 102. Note that, there is a parasitic capacitor Cp between the p-type substrate 101 and the n-type semiconductor region 111.

The n-type semiconductor region 112 is formed along an outer peripheral edge of the n-type semiconductor region 111 so as to surround part of the n-type epilayer 102. Note that the n-type semiconductor regions 111 and 112 (and the n-type epilayer 102 electrically conductive to these) correspond to a collector (C) of the transistor 110. The n-type semiconductor region 112, for electrical conductivity to a wiring layer, at least part of its surface is exposed without being covered by the insulating layer 104 or 104x.

The p-type semiconductor region 113 is formed at such part of a surface of the n-type epilayer 102 as is surrounded by the n-type semiconductor regions 111 and 112.

The n-type semiconductor region 114 is formed at a surface of the p-type semiconductor region 113. The n-type semiconductor region 114 corresponds to an emitter (E) of the transistor 110, and, for electrical conductivity to a wiring layer, at least part of its surface is exposed without being covered by the insulating layer 104 or 104x.

The p-type semiconductor region 115 is formed at the surface of the p-type semiconductor region 113. The p-type semiconductor regions 113 and 115 correspond to a base (B) of the transistor 110, and, for electrical conductivity to a wiring layer, at least part of a surface of the p-type semiconductor region 115 is exposed without being covered by the insulating layer 104 or 104x.

The conductive member 116 establishes electrical conductivity between a line L11 and the n-type semiconductor region 112 (the collector (C)). For convenience of illustration, FIG. 1 omits illustration of conductive members and lines connected to the n-type semiconductor region 114 (the emitter (E)) and the p-type semiconductor region 115 (the base (B)).

On the other hand, the transistor 120 is formed of an n-type semiconductor region 121, an n-type semiconductor region 122, a p-type semiconductor region 123, a p-type semiconductor region 124, a p-type semiconductor region 125, and a conductive member 126.

The n-type semiconductor region 121 is embedded at the boundary surface between the p-type substrate 101 and the n-type epilayer 102. Note that there is a parasitic capacitor Cp between the p-type substrate 101 and the n-type semiconductor region 121.

The n-type semiconductor region 122 is formed along an outer peripheral edge of the n-type semiconductor region 121 so as to surround part of the n-type epilayer 102. The n-type semiconductor regions 121 and 122 (and the n-type epilayer 102 which is electrically conductive to these) correspond to a base (B) of the transistor 120, and, for electrical conductivity to a wiring layer, at least part of a surface of the n-type semiconductors region 122 is exposed without being covered by the insulating layer 104 or 104x.

The p-type semiconductor region 123 is formed in an endless shape in plan view at such part of the surface of the n-type epilayer 102 as is surrounded by the n-type semiconductor regions 121 and 122.

The p-type semiconductor region 124 is formed on a surface of the p-type semiconductor region 123. The p-type semiconductor regions 123 and 124 correspond to a collector (C) of the transistor 120, and, for electrical conductivity to a wiring layer, at least part of a surface of the p-type semiconductor region 124 is exposed without being covered by the insulating layer 104 or 104x.

The p-type semiconductor region 125 is formed, at such part of the surface of the n-type epilayer 102 as is surrounded by the n-type semiconductor regions 121 and 122, at a position surrounded by the p-type semiconductor region 124. The p-type semiconductors region 125 corresponds to an emitter (E) of the transistor 120, and, for electrical conductivity to a wiring layer, at least part of its surface is exposed without being covered by the insulating layer 104 or 104x.

The conductive member 126 establishes electrical conductivity between a line L12 and the n-type semiconductor region 122 (the base (B)). For convenience of illustration, FIG. 1 omits illustration of conductive members and lines connected to the p-type semiconductors region 124 (the collector (C)) and the p-type semiconductor region 125 (the emitter (E)).

Now, in the semiconductor device 100 according to this comparative example, a distance between circuit elements (in FIG. 1, the distance between the transistor 110 and the transistor 120) is made as long as possible, and a line L13 for a shield is laid between the elements, to thereby prevent noise propagation at a top surface (an upper layer) of the semiconductor device 100.

However, even with such noise countermeasures as described just above, with respect to noise that propagates via the p-type substrate 101 to an internal portion (a lower layer) of the semiconductor device 100 due to effect of the parasitic capacitor Cp of the transistors 110 and 120, it is difficult to prevent the propagation.

Proposed below are new embodiments capable of alleviating such inconvenience.

Semiconductor Device (First Embodiment)

Figure 2:
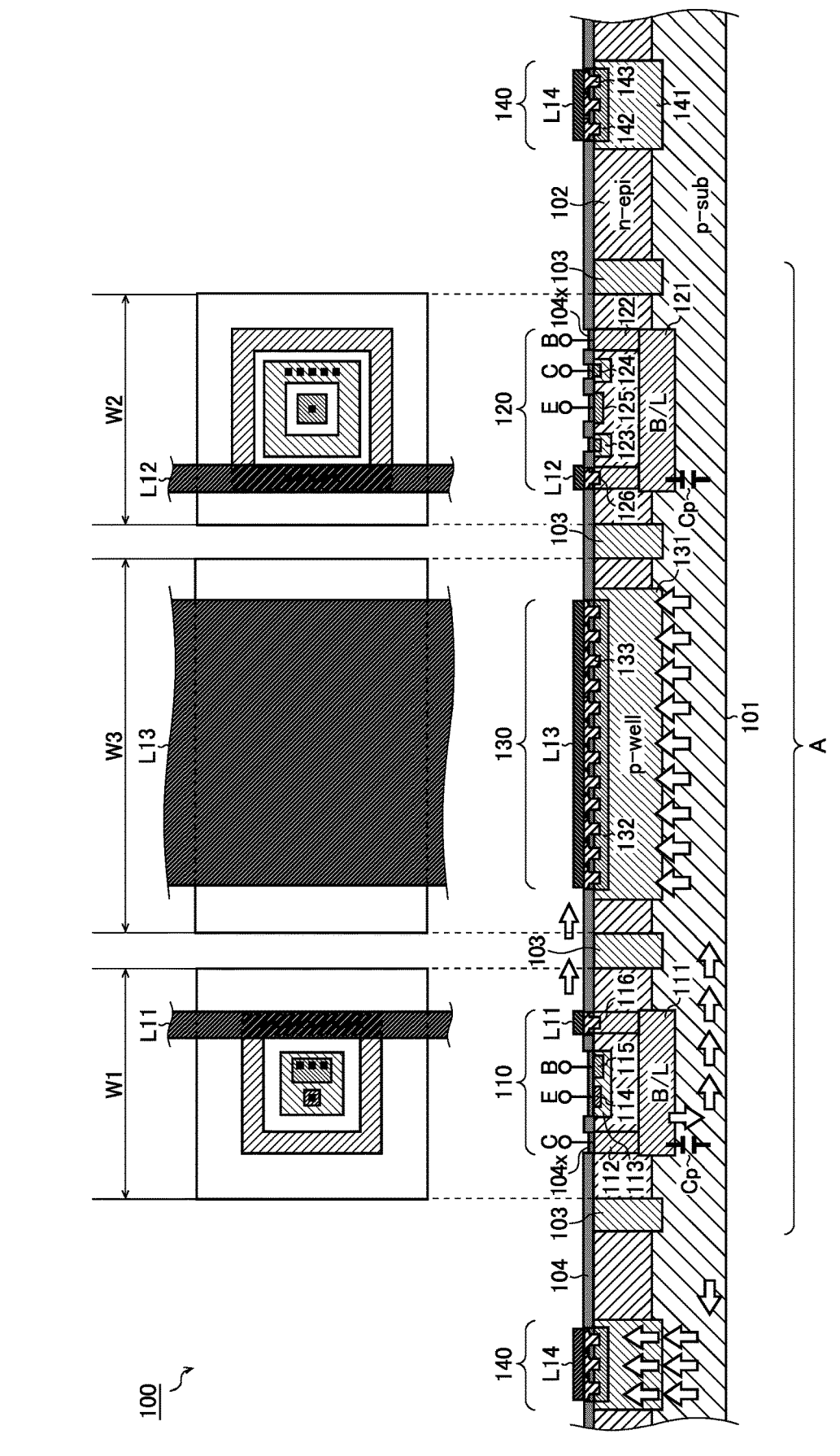
FIG. 2 is a diagram showing a semiconductor device according to a first embodiment.

FIG. 2 is a diagram (of which the upper part is a plan view and the lower part is a vertical sectional view) showing a semiconductor device according to a first embodiment A semiconductor device 100 according to this embodiment, while being based on the above-described comparative example (FIG. 1), further includes a first subcontact 130 and a second subcontact 140.

The first subcontact 130 is arranged adjacent to both the transistors 110 and 120 (in FIG. 2, between the transistors 110 and 120) which are formed in the element arrangement region A. Note that the first subcontact 130 is formed of, along with the previously-described line L13 serving as a shield, a p-type semiconductor region 131, a p-type semiconductor region 132, and a conductive member 133.

The p-type semiconductor region 131 penetrates through the n-type epilayer 102 in the up-and-down direction from a top surface through a bottom surface of the epilayer 102, and establishes electrical conductivity between the line L13 and the p-type substrate 101. Note that the p-type semiconductor region 131 does not form a circuit element (excluding a parasitic element) such as a transistor. The line L13 may be electrically conductive, for example, to a ground pad. The p-type semiconductor region 131 may be formed through a process common to the p-type element isolation portion 103.

The p-type semiconductor region 132 is formed at a surface of the p-type semiconductor region 131. For electrical conductivity to a wiring layer, at least part of a surface of the p-type semiconductors region 132 is exposed without being covered by the insulating layer 104 or 104x.

Note that the previously-described p-type semiconductor region 131 contains a comparatively low concentration of p-type impurity, and thus has a high impedance. Thus, by adding the p-type semiconductor region 132 having a higher concentration of p-type impurity than the p-type semiconductor region 131, the impedance is lowered. Further, since the p-type semiconductor region 132 is electrically conducted via the conductive member 133 to the line L13, a low impedance is achieved in the first subcontact 130 as a whole.

The conductive member 133 establishes electrical conductivity between the line L13 and the p-type semiconductors region 132.

Now, the line L13 has a lower impedance than the p-type substrate 101. Specifically, while the line L13 (for example, an Al line) has a sheet resistance of several tens mΩ/sq, the p-type substrate 101 has a sheet resistance of several hundreds Ω.

Accordingly, for instance, noise that propagates from the transistor 110 via the p-type substrate 101 to an inside (a lower layer) of the semiconductor device 100 propagates to the first subcontact 130 without reaching the transistor 120, and the noise is eventually let to escape through the line L13 toward the ground pad. Noise that propagates on the top surface (the upper layer) of the semiconductor device 100 is absorbed by the line L13 in a manner similar to in the previously-described comparative example (FIG. 1).

Thus, by introducing the first subcontact 130 (that is, by regulating the impedance of the p-type substrate 101), it is possible to improve the noise characteristics (in particular, the electromagnetic susceptibility) of the semiconductor device 100.

Furthermore, to enhance the effect of improving the noise characteristics, it is desirable to design a width W3 of the first subcontact 130 to be equal to or wider than minimum process widths of the circuit elements (in FIG. 2, minimum process widths W1 and W2 of the transistors 110 and 120, respectively) formed in the element arrangement region A.

Generally, the minimum process widths W1 and W2 of the transistors 110 and 120, respectively, are often several tens μm (of the order of 50 μm). In view of this, it is desirable that the width W3 of the first subcontact 130 be equal to or wider than 50 μm (more desirably, equal to or wider than 60 μm).

Note that, in FIG. 2, the width W3 of the first subcontact 130 is defined as the width of the region sandwiched by the p-type element isolation portion 103, but instead, for example, the width of the p-type semiconductor region 131 or the width of the line L13 may be defined as the width W3 of the first subcontact 130.

On the other hand, the second subcontact 140, as a GND guard ring surrounding the element arrangement region A, is arranged, for example, along an outer peripheral edge of the p-type substrate 101. Note that the second subcontact 140 is formed of, along with a line L14, a p-type semiconductor region 141, a p-type semiconductor region 142, and a conductive member 143.

The p-type semiconductor region 141 penetrates through the n-type epilayer 102 in the up-and-down direction from the top surface through the bottom surface of the epilayer 102, and establishes electrical conductivity between the line L14 and the p-type substrate 101. Note that the p-type semiconductor region 141 does not form a circuit element (excluding a parasitic element) such as a transistor. The line L14 may be electrically conducted, for example, to the ground pad. The p-type semiconductor region 141 may be formed through a process common to the p-type element isolation portion 103 and the p-type semiconductor region 131.

The p-type semiconductor region 142 is formed at a surface of the p-type semiconductor region 141. At least part of a surface of the p-type semiconductor region 142 is exposed without being covered by the insulating layer 104 or 104x.

Note that the previously-described p-type semiconductor region 141 contains a comparatively low concentration of p-type impurity, and thus has a high impedance. Thus, by adding the p-type semiconductor region 142 having a higher concentration of p-type impurity than the p-type semiconductor region 141, the impedance is lowered. Further, since the p-type semiconductor region 142 is electrically conducted via the conductive member 143 to the line L14, a low impedance is achieved in the second subcontact 140 as a whole.

The conductive member 143 establishes electrical conductivity between the line L14 and the p-type semiconductors region 142.

Now, like the previously-described line L13, the line L14 has a lower impedance than the p-type substrate 101. Accordingly, it is possible, for example, to have the second subcontact 140 absorb noise before the noise intrudes into the inside of the chip of the semiconductor device 100.

Note that, among various circuit blocks integratable in the semiconductor device 100, an operational amplifier (in particular, a differential input stage) can be mentioned as an example in which noise interference should be avoided. Accordingly, the following description will discuss the improvement of the noise characteristics of an operational amplifier achieved through impedance regulation.

<Operational Amplifier>

Figure 3:
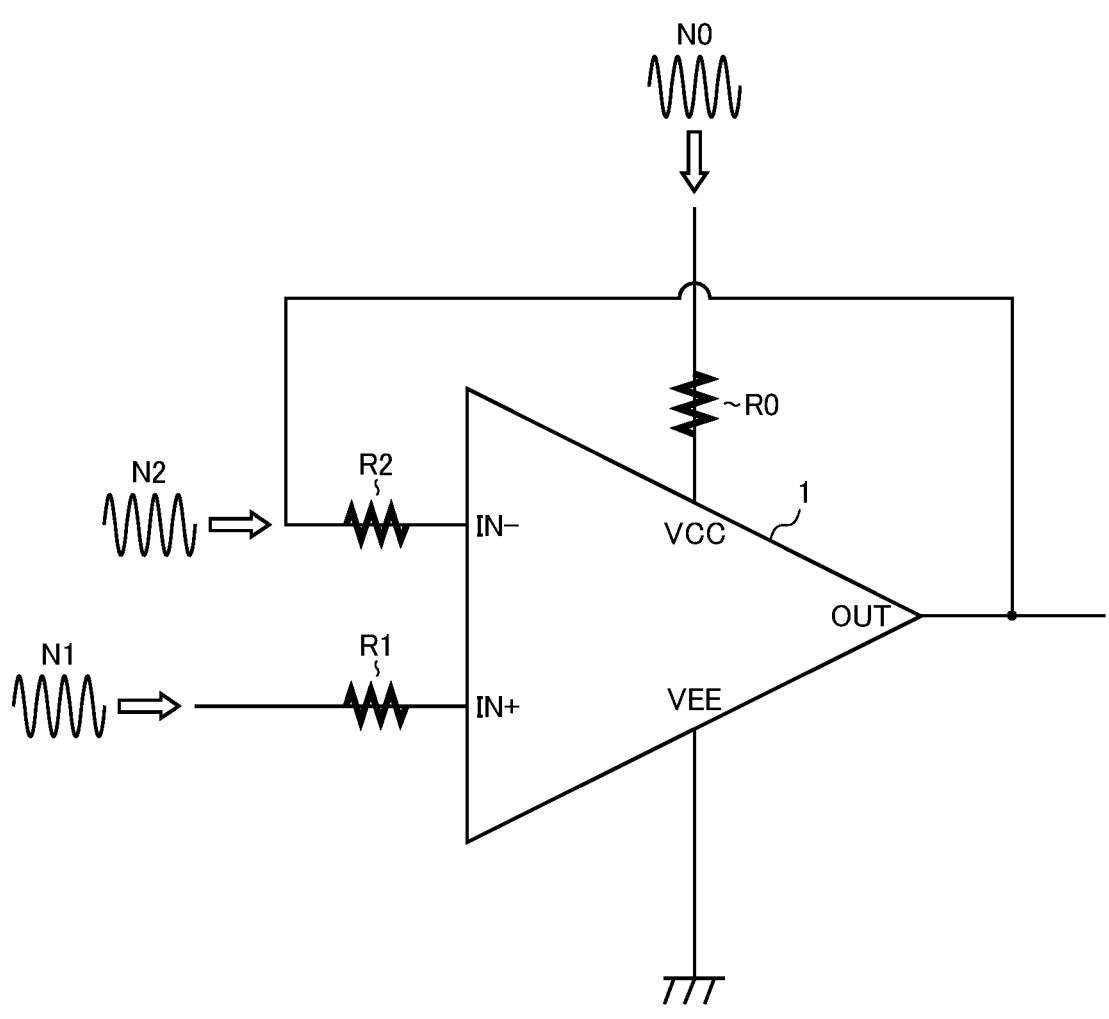
FIG. 3 is a diagram for illustrating a basic concept of improving noise characteristics through impedance regulation.

FIG. 3 is a diagram for illustrating a basic concept of improving the noise characteristics of an operational amplifier through impedance regulation.

As shown in FIG. 3, examples of noise signals externally input to an operational amplifier 1 according to this configuration example mainly include a noise signal N0 input to a power supply terminal VCC, a noise signal N1 input to a non-inverting input terminal IN+, a noise signal N2 input to an inverting input terminal IN− due to an output terminal OUT shaking and interference from a noise input line, etc.

Against such noise signals, the operational amplifier 1 according to this configuration example includes a resistor R0 (corresponding to a power supply resistor) connected to the power supply terminal VCC, and resistors R1 and R2 (corresponding to input resistors) connected to the non-inverting input terminal IN+ and the inverting input terminal IN−, respectively. With this configuration, it is possible to raise terminal impedances of the power supply terminal VCC, the non-inverting input terminal IN+, and the inverting input terminal IN−, and thus to reduce input of the noise signals N0 to N2.

Figure 4:
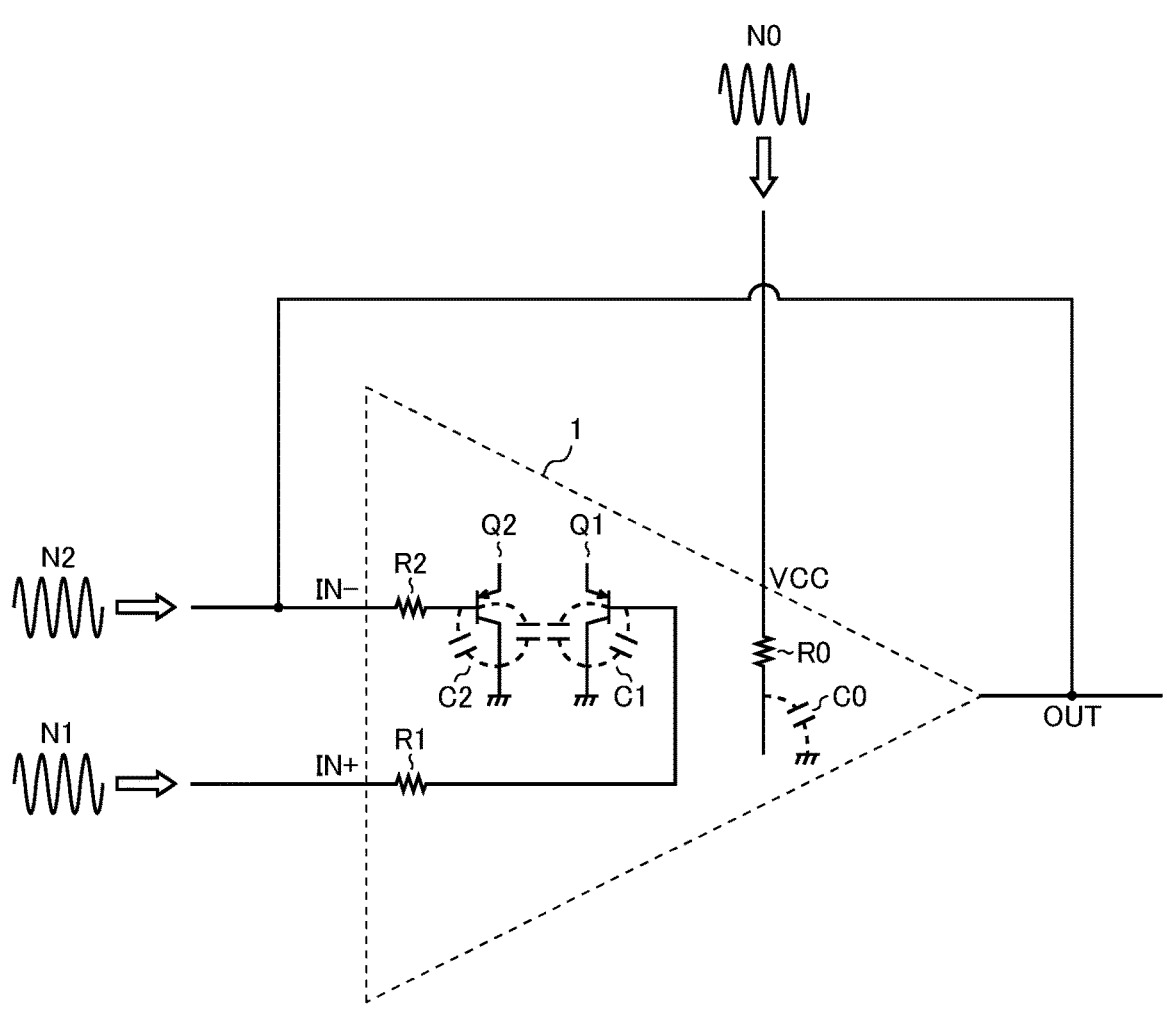
FIG. 4 is a diagram showing how a low-pass filter is formed, using a resistor, inside an operational amplifier.

FIG. 4 is a diagram showing how a low-pass filter (what is called an electro-magnetic interference (EMI) filter) is formed inside the operational amplifier 1 using the resistors R0 to R2.

As shown in FIG. 4, the resistor R0, together with a parasitic capacitor C0 of a power supply line of the operational amplifier 1, forms a low-pass filter. Further, the resistors R1 and R2 respectively form low-pass filters together with parasitic capacitors C1 and C2 of pnp-type bipolar transistors Q1 and Q2 which form an input stage of the operational amplifier 1.

Thus, in the operational amplifier 1 according to the present configuration example, the parasitic capacitors of various components of the operational amplifier 1 are used as constituent elements of the low-pass filters. With such a configuration, there is no need of separately adding a capacitor to form a low-pass filter, and this helps prevent inviting problems such as deterioration of phase margin and increase of circuit area in the operational amplifier 1.

Here, a resistance value R of each of the resistors R1 and R2 can be set based on formula (1) below, using a capacitance value C of each of the parasitic capacitors C1 and C2 and a target cutoff frequency fc of each low-pass filter.

$$R = 1/(2\pi \cdot fc \cdot C) \qquad (1)$$

For example, in a case where C=8.5 pF, and fc=20 MHz, the resistance value R can be set such that R≈900Ω.

Here, basically, a resistance value of the resistor R0 can also be set based on formula (1) above. However, since the resistor R0 is inserted in the power supply line of the operational amplifier 1, in setting its resistance value, full attention should be paid to preventing the power supply voltage of the operational amplifier 1 from falling below the lower-limit driving voltage of the operational amplifier 1. Note that, in a case where only a minimal resistor can be used as the resistor R0, along with the parasitic capacitor C0, a minimum number of capacitors necessary may be separately added.

Semiconductor Device (Second Embodiment)

Figure 5:
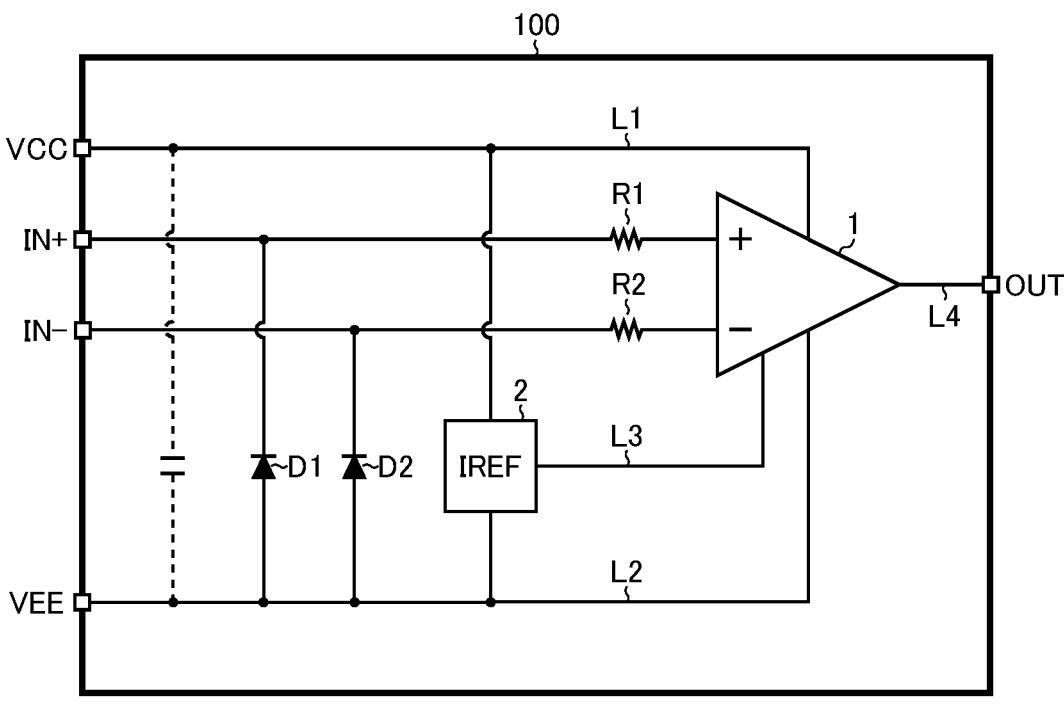
FIG. 5 is a diagram showing a semiconductor device according to a second embodiment.

FIG. 5 is a diagram showing a semiconductor device according to a second embodiment. A semiconductor device 100 according to this embodiment is what is called an operational amplifier 1C, which is a monolithic semiconductor integrated circuit device, and the semiconductor device 100 includes, integrated therein, the operational amplifier 1, a reference current setting portion 2, an electrostatic protection element 3 (electrostatic protection diodes D1 and D2), the power supply line L1, a ground line L2, a reference current setting line L3, and an output line L4.

The semiconductor device 100 further includes, as means for establishing electrical connection with outside the device, a plurality of external terminals (a power supply terminal VCC, a non-inverting input terminal IN+, an inverting input terminal IN–, a ground terminal VEE, and an output terminal OUT).

The operational amplifier 1, as described previously, includes the resistors R1 and R2 which form low-pass filters together with the unillustrated parasitic capacitors C1 and C2 (see FIG. 4). Specifically, a non-inverting input node (+) of the operational amplifier 1 is connected, via the resistor R1, to the non-inverting input terminal IN+ of the semiconductor device 100. An inverting input node (–) of the operational amplifier 1 is connected, via the resistor R2, to the inverting input terminal IN– of the semiconductor device 100. Note that, although FIG. 5 illustrates an example where one channel of operational amplifier 1 is integrated in the semiconductor device 100, but a plurality of channels of operational amplifiers 1 may instead be integrated in the semiconductor device 100.

The reference current setting portion 2 sets a reference current Iref to pass in the operational amplifier 1.

The power supply line L1 is laid between the power supply terminal VCC of the semiconductor device 100 and the power supply node of each of the operational amplifier 1 and the reference current setting portion 2. The ground line L2 is laid between the ground terminal VEE of the semiconductor device 100 and a ground node of each of the operational amplifier 1 and the reference current setting portion 2. The reference current setting line L3 is laid between a reference current setting node of the operational amplifier 1 and an output node of the reference current setting portion 2. The output line L4 is laid between an output node of the operational amplifier 1 and the output terminal OUT of the semiconductor device 100.

A cathode of the electrostatic protection diode D1 is connected to the non-inverting input terminal IN+ of the semiconductor device 100. A cathode of the electrostatic protection diode D2 is connected to the inverting input terminal IN– of the semiconductor device 100. Anodes of the electrostatic protection diodes D1 and D2 are both connected to the ground terminal VEE of the semiconductor device 100. Thus, with this configuration having the electrostatic protection diodes D1 and D2, a high surge resistance can be achieved.

Now, widespread semiconductor devices often have a bypass capacitor (for example, 100 pF) for regulating the power supply voltage inserted between the power supply terminal and the ground terminal thereof. However, if a bypass capacitor is inserted between the power supply terminal VCC and the ground terminal VEE of the semiconductor device 100, the input impedance of the power supply terminal VCC with respect to high frequency signals decreases, so that it becomes more likely for noise signals (high frequency signals) to reach the power supply node of the operational amplifier 1 to deteriorate noise characteristics of the operational amplifier 1.

Thus, in the semiconductor device 100 according to this embodiment, as indicated by the broken line in FIG. 5, no bypass capacitor is connected between the power supply terminal VCC and the ground terminal VEE, and furthermore, parasitic capacitance between the power supply line L1 and the ground line L2 is reduced as much as possible (for example, 20 pF or lower). With this configuration, the input impedance of the power supply terminal VCC with respect to high frequency signals rises, so that it becomes less likely for noise signals to reach the power supply node of the operational amplifier 1, and thus the noise characteristics of the operational amplifier 1 can be improved.

Figure 6:
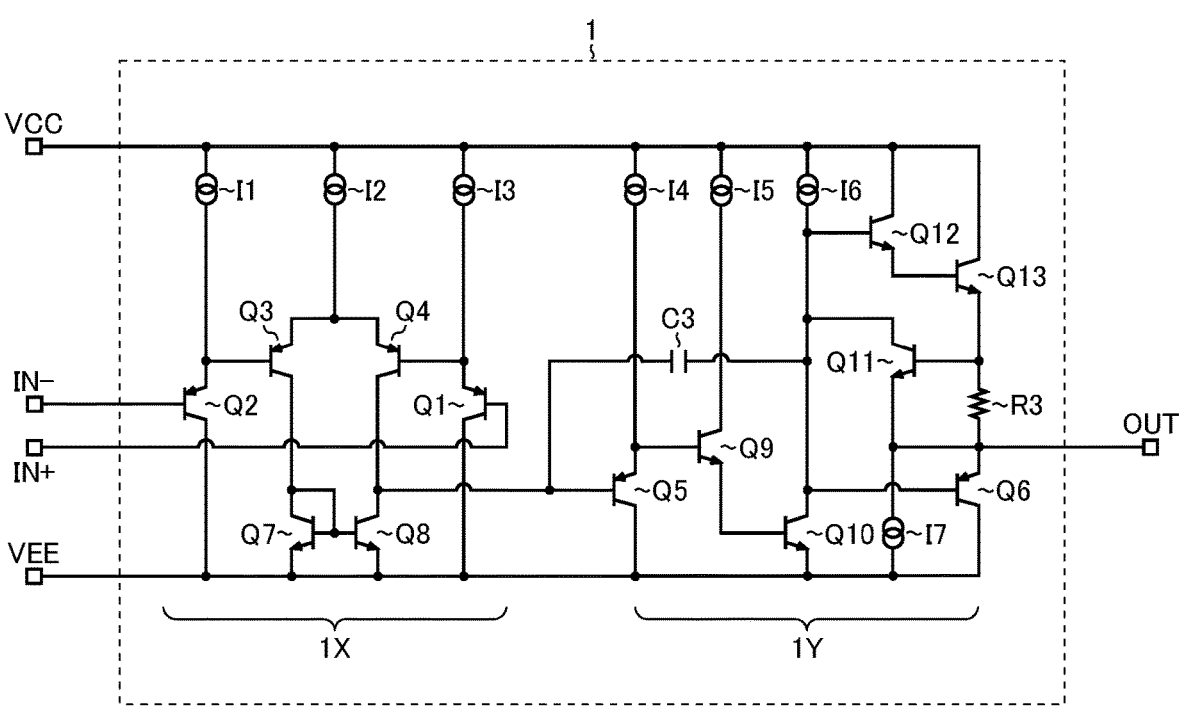
FIG. 6 is a diagram showing a configuration example of an operational amplifier.

FIG. 6 is a diagram showing a configuration example of the operational amplifier 1. The operational amplifier 1 of the present configuration example includes, in addition to the previously-described pnp-type bipolar transistors Q1 and Q2, pnp-type bipolar transistors Q3 to Q6, npn-type bipolar transistors Q7 to Q13, a resistor R3, a capacitor C3, and current sources I1 to I7. Note that the current sources I1 to I7 each pass the reference current Iref set by the reference current setting portion 2 (or a constant current corresponding to the reference current Iref).

First terminals of the current sources I1 to I3 are connected to the power supply terminal VCC. A second terminal of the current source I1 is connected to an emitter of the transistor Q2 and a base of the transistor Q3. A second terminal of the current source I2 is connected to emitters of the transistors Q3 and Q4. A second terminal of the current source I3 is connected to an emitter of the transistor Q1 and a base of the transistor Q4.

A base of the transistor Q1 is connected to the non-inverting input terminal IN+ via the unillustrated resistor R1 (see FIG. 3 to FIG. 5). A base of the transistor Q2 is connected to the inverting input terminal IN– via the unillustrated resistor R2 (see FIG. 3 to FIG. 5). Collectors of the transistors Q1 and Q2 are both connected to the ground terminal VEE.

A collector of the transistor Q3 is connected to a collector of the transistor Q7. A collector of the transistor Q4 is connected to a collector of the transistor Q8. Bases of the transistors Q7 and Q8 are both connected to the collector of the transistor Q7. Emitters of the transistors Q7 and Q8 are both connected to the ground terminal VEE.

The current sources I1 to I3, the transistors Q1 to Q4, and transistors Q7 and Q8, which are connected as described above, form a differential input stage 1X of the operational amplifier 1.

First terminals of the current sources I4 and I5 are both connected to the power supply terminal VCC. A second terminal of the current source I4 is connected to an emitter of the transistor Q5 and a base of the transistor Q9. A second terminal of the current source I5 is connected to a collector of the transistor Q9.

A base of the transistor Q5 is connected to the collector of the transistor Q8 and a first terminal of the capacitor C3. A second terminal of the capacitor C3 is connected to a collector of the transistor Q10. An emitter of the transistor Q9 is connected to a base of the transistor Q10. A collector of the transistor Q5 and an emitter of the transistor Q10 are both connected to the ground terminal VEE.

A first terminal of the current source I6 and collectors of the transistors Q12 and Q13 are all connected to the power supply terminal VCC. A second terminal of the current source I6 is connected to collectors of the transistors Q10 and Q1 and a base of the transistor Q12. An emitter of the transistor Q12 is connected to a base of the transistor Q13. An emitter of the transistor Q13 is connected to abase of the transistor Q11 and a first terminal of the resistor R3.

Emitters of the transistors Q6 and Q11, a second terminal of the resistor R3, and a first terminal of the current source I7 are all connected to the output terminal OUT. The base of the transistor Q6 is connected to the collector of the transistor Q10. A second terminal of the current source I7 and the collector of the transistor Q6 are both connected to the ground terminal VEE.

The current sources 14 to 17, the transistors Q5 and Q6, the transistors Q9 to Q13, the capacitor C3, and the resistor R3, which are connected as described above, form an amplification output stage 1Y of the operational amplifier 1.

However, the circuit configuration shown in FIG. 6 is merely an example, and any circuit configuration may be adopted as long as it can achieve a desired operation as the operational amplifier 1.

Note that, in a case where, in the semiconductor device 100 according to the second embodiment (FIG. 5), the device structure according to the first embodiment (FIG. 2) is applied, for example, the previously-described first sub-contact 130 may be disposed so as to be adjacent to the transistors Q1 and Q2 which form the differential input stage 1X of the operational amplifier 1. When viewing from the opposite side, the transistor 110 of FIG. 2 may be construed as corresponding to the transistors Q1 and Q2. With this device structure, it is possible to effectively reduce noise interference in the operational amplifier 1.

Semiconductor Device (Third Embodiment)

Figure 7:
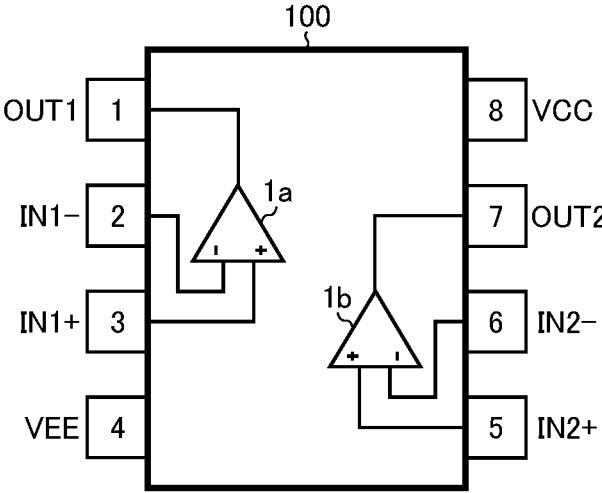
FIG. 7 is a diagram showing a semiconductor device according to a third embodiment.

FIG. 7 is a diagram showing a semiconductor device according to a third embodiment. A semiconductor device 100 according to this embodiment includes, integrated therein, two channels of operational amplifiers 1a and 1b (each corresponding to the previously-described operational amplifier 1). In FIG. 7, for convenience of illustration, illustration of components other than the operational amplifiers 1a and 1b is omitted.

Further, as the package of the semiconductor device 100, there may be adopted a Small Outline Package (SOP), a Shrink SOP (SSOP), or, a Micro SOP (MSOP), each having four terminals derived from each of two opposite sides thereof, thus each having a total of eight external terminals (pin-1 to pin-8) derived therefrom. In FIG. 7, pin-1 to pin-4 are provided on a first side of the package, and pin-5 to pin-8 are provided on a second side of the package.

Pin-1 is an output terminal OUT1 of a first channel, and is connected to an output terminal of the operational amplifier 1a. Pin-2 is an inverting input terminal IN1– of the first channel, and is connected to an inverting input terminal (–) of the operational amplifier 1a. Pin-3 is anon-inverting input terminal IN1+ of the first channel, and is connected to a non-inverting input terminal (+) of the operational amplifier 1a. Pin-4 is the ground terminal VEE.

Pin-5 is a non-inverting input terminal IN2+ of the second channel, and is connected to a non-inverting input terminal (+) of the operational amplifier 1b. Pin-6 is an inverting input terminal IN2– of the second channel, and is connected to an inverting input terminal (–) of the operational amplifier 1b. Pin-7 is an output terminal OUT2 of the second channel, and is connected to an output terminal of the operational amplifier 1b. Pin-8 is the power supply terminal VCC.

Thus, the external terminals (pin-1 to pin-3) of the first channel are all disposed on the first side of the package, and the external terminals (pin-5 to pin-7) of the second channel are all disposed on the second side of the package.

Note that, although FIG. 7 illustrates an example where the two channels of operational amplifiers 1a and 1b are integrated, it is also possible to integrate four channels of operational amplifiers. In that case, for example, an SOP, an SSOP or an MSOP that has 14 pins can be preferably used.

Figure 8:
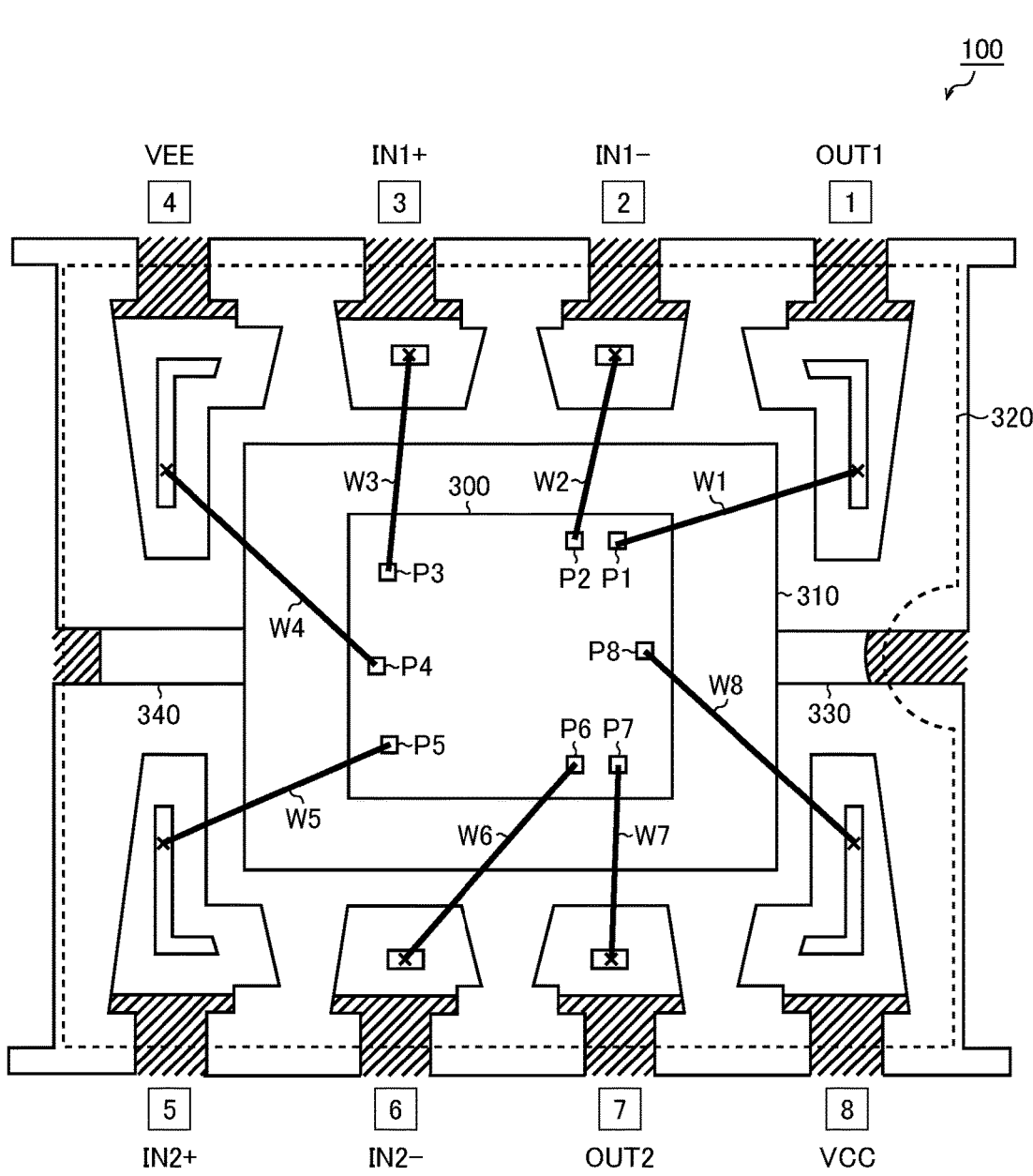
FIG. 8 is a diagram showing an example of packaging.

FIG. 8 is a diagram showing an example of packaging in the third embodiment. In the semiconductor device 100, the operational amplifiers 1a and 1b, etc. are integrated in a semiconductor chip 300, which is mounted on an island 310 and sealed in that state with a mold resin 320. In the following description, the upward, downward, leftward, and rightward directions in the sheet on which FIG. 8 is drawn are respectively defined as the upward, downward, leftward, and rightward directions in plan view of the semiconductor device 100 (or the semiconductor chip 300).

The semiconductor chip 300 includes eight pads, which are pads P1 to P8. The pad P1 is a pad corresponding to the output terminal of the operational amplifier 1a, and is connected to a leading end side of pin-1 (OUT1) via a wire W1. The pad P2 is a pad corresponding to the inverting input terminal (–) of the operational amplifier 1a, and is connected to pin-2 (IN1–) via a wire W2. The pad P3 is a pad corresponding to the inverting input terminal (+) of the operational amplifier 1a, and is connected to pin-3 (IN1+) via a wire W3. The pad P4 is aground pad, and is connected to a leading end side of pin-4 (VEE) via a wire W4.

The pad P5 is a pad corresponding to the non-inverting input terminal (+) of the operational amplifier 1b, and is connected to pin-5 (IN2+) via a wire W5. The pad P6 is a pad corresponding to the inverting input terminal (–) of the operational amplifier 1b, and is connected to pin-6 (IN2–) via a wire W6. The pad P7 is a pad corresponding to the output terminal of the operational amplifier 1b, and the pad P7 is connected to a leading end side of pin-7 (OUT2) via a wire W7. The pad P8 is a power supply pad, and is connected to a leading end side of pin-8 (VCC) via a wire W8.

The pads P1 to P8 are arranged along the outer peripheral edge of the semiconductor chip 300 in order corresponding to pin-1 to pin-8. Accordingly, it is possible to shorten the lengths of the wires W1 to W8 laid to connect the pads and the pins.

In terms of frame area inside the package, pin-1 (OUT1), pin-4 (VEE), pin-5 (IN2+), and pin-8 (VCC) are all larger than any of pin-2 (IN–), pin-3 (IN1+), pin-6 (IN2–), and pin-7 (OUT2).

That is, in terms of the up-and-down direction of the sheet on which FIG. 8 is drawn, pin-1 (OUT1) and pin-4 (VEE) each have a portion projecting more than pin-2 (IN1–) and pin-3 (IN1+). Likewise, pin-5 (IN2+) and pin-8 (VCC) each have a portion projecting more than pin-6 (IN2–) and pin-7 (OUT2).

Further, in terms of leftward and rightward directions of the sheet, pin-1 (OUT1) and pin-4 (VEE) each have a part thereof overlapping with an island 310. Likewise, pin-5 (IN2+) and pin-8 (VCC) each have a part thereof overlapping with the island 310.

Furthermore, between pin-1 (OUT) and pin-8 (VCC), and between pin-4 (VEE) and pin-5 (IN2+), there are formed support frames 330 and 340, respectively, to support the island 310.

Figure 9:
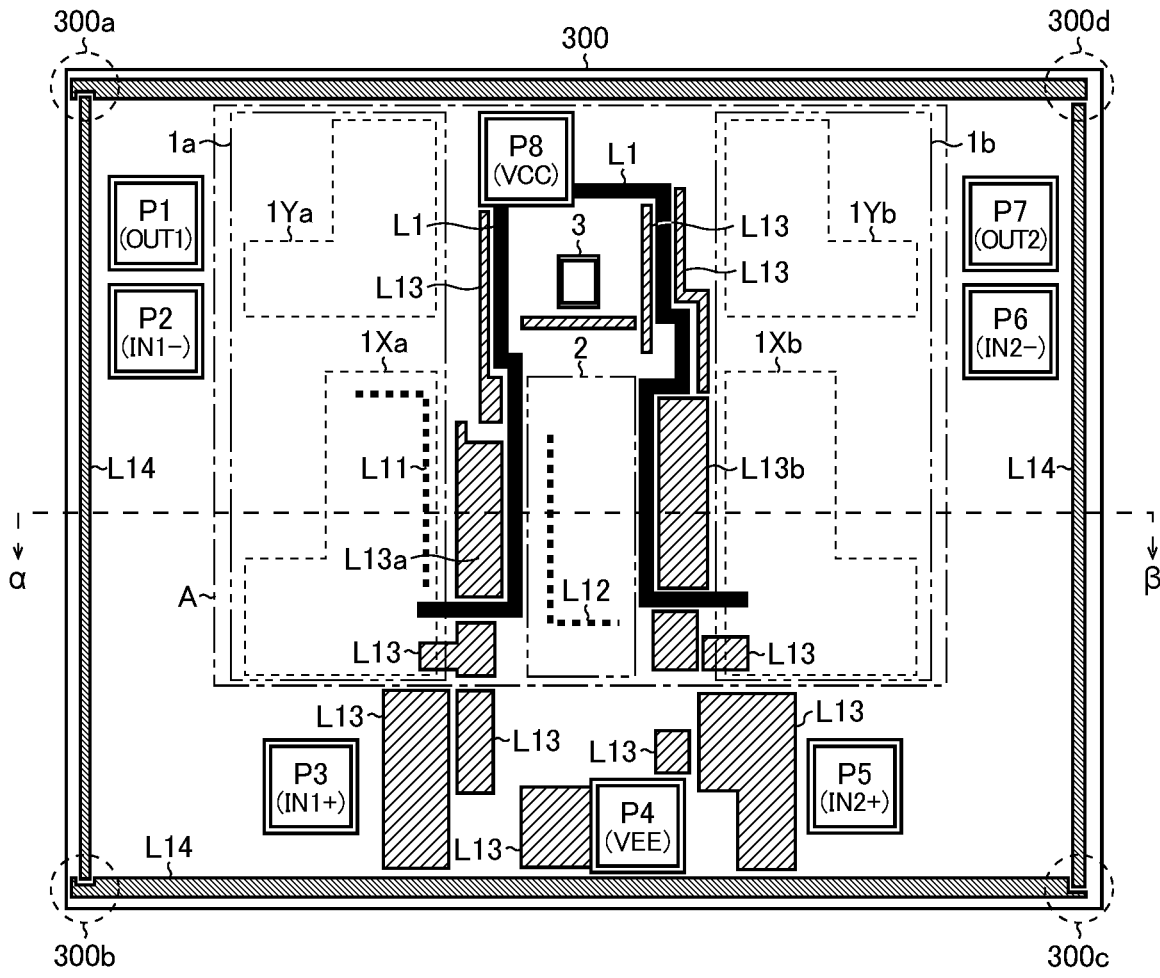
FIG. 9 is a diagram showing an example of line layout.

FIG. 9 is a diagram showing an example of wiring layout in the third embodiment. Hereinafter, the upward, downward, leftward, and rightward directions of the sheet on which FIG. 9 is drawn are respectively defined as the upward, downward, leftward, and rightward directions in plan view of the semiconductor chip 300, and wiring layout (and pad arrangement) will be described below, with appropriate reference also to FIGS. 7 and 8 referred to previously.

Note that the left side of the semiconductor chip 300 in FIG. 9 corresponds to the upper side of the semiconductor chip 300 in FIG. 8. Likewise, the left side, the upper side, and the lower side of the semiconductor chip 300 in FIG. 9 respectively correspond to the lower side, the right side, and the left side of the semiconductor chip 300 in FIG. 8. In other words, the semiconductor chip 300 illustrated in FIG. 9 corresponds to the semiconductor chip 300 illustrated in FIG. 8 after it is rotated counterclockwise by 90°.

Further, in plan view of the semiconductor chip 300, the positions at which the pads P1 to P8 are located correspond to their respective positions shown in FIG. 8 referred to previously.

Specifically, the pad P1 (OUT1) and the pad P2 (IN1−) are arranged, in the vicinity of an upper-left corner 300a of the semiconductor chip 300, in the order of the pad P1 and the pad P2 in the direction from the upper side toward the lower side of the sheet on which FIG. 9 is drawn.

The pad P3 (IN1+), the pad P4 (VEE), and the pad P5 (IN2+) are arranged, in the vicinity of the lower side of the semiconductor chip 300, in the order of the pad P3, the pad P4, and the pad P5 in the direction from the left side to the right side of the sheet. Here, the pad P4 is disposed approximately at the center of the lower side of the semiconductor chip 300 in the left-right direction.

The pad P6 (IN2−) and the pad P7 (OUT2) are arranged, in the vicinity of an upper-right corner 300d of the semiconductor chip 300, in the order of the pad P6 and the pad P7 in the direction from the lower side toward the upper side of the sheet.

The pad P8 (VCC) is disposed approximately at the center of the upper side of the semiconductor chip 300 in the left-right direction.

The power supply line L1 is laid from the pad P8 (VCC), while being bent or branched, toward various circuit elements (for example, the operational amplifiers 1a, 1b and the reference current setting portion 2) formed in the element arrangement region A. FIG. 9 shows an example where the power supply line L1 includes two routes both extending in the up-and-down direction of the sheet, but the power supply line L1 may include another route extending in another direction.

The element arrangement region A occupies a center part of the semiconductor chip 300, and is surrounded by the pads P1 to P8. Further, inside the element arrangement region A, from the left side to the right side of the sheet on which FIG. 9 is drawn, various circuit blocks are formed in the order of the operational amplifier 1a (which includes a differential input stage 1Xa and an amplification output stage 1Ya), the reference current setting portion 2 and the electrostatic protection element 3, and the operational amplifier 1b which includes a differential input stage 1Xb and an amplification output stage 1Yb). Needless to say, other circuit blocks may be formed in the element arrangement region A.

Here, in FIG. 9, corresponding to FIG. 10, which will be referred to later, the line L11 and the line L12 connected to the operational amplifier 1a and the reference current setting portion 2, respectively, are illustrated with thick broken lines.

Further, between the differential input stage 1Xa of the operational amplifier 1a and the reference current setting portion 2, and between the differential input stage 1Xb of the operational amplifier 1b and the reference current setting portion 2, a line L13a and a line L13b are laid, respectively. These lines L13a and L13b form first subcontacts 130a and 130b, respectively, each having a lower impedance than the p-type substrate 101 (see also FIG. 10 referred to later).

Note that the line L13 forming the first subcontact 130 is laid so as to be divided into a plurality of lines including the lines L13a and L13b laid inside the element arrangement region A. That is, in the semiconductor chip 300, there are formed a plurality of first subcontacts 130 which are electrically conducted to the p-type substrate 101, and part of which is arranged inside the element arrangement region A.

Further, the plurality of lines L13 described just above are arranged in a stepping-stone manner from the element arrangement region A to the pad P4 (VEE), and at least one of the lines L13 is electrically conducted to the pad P4 (VEE). That is, each of the plurality of lines L13 is either directly connected to the pad P4 (VEE) or in an electrically floating state. Here, the line L13 is divided into the plurality of lines in order that another line (for example, the power supply line L1) formed in the same wiring layer can be laid in a gap region between the plurality of lines L13.

By adopting this wiring layout, it becomes possible to form a noise propagation path with a low impedance via the series of lines L13 arranged adjacent to each other in the stepping-stone manner, without preventing the laying of the power supply line L1 and the like. As a result, it becomes possible to have noise propagating inside the element arrangement region A absorbed by the line L13 to eventually let the noise escape to the pad P4 (VEE), and thus to improve the noise characteristics of each of the operational amplifiers 1a and 1b.

Here, regarding the lines L13a and L13b, which are arranged adjacent to specific circuit elements (for example, the transistors that form the differential input stages 1Xa and 1Xb of the operational amplifiers 1a and 1b, respectively) of the plurality of circuit elements formed inside the element arrangement region A, in which specific circuit elements noise interference should be avoided, the lines L13a and L13b are desirably designed to have a wider width than such lines L13 as are not arranged adjacent to the specific circuit elements.

Further, as shown in FIG. 9, it is desirable that the lines L13 (and thus the first subcontacts 130) be formed between the differential input stages 1Xa and 1Xb and the power supply line L1, between the amplification output stages 1Ya and 1Yb and the power supply line L1 or the reference current setting portion 2, and between the electrostatic protection element 3 and the power supply line L1.

Here, the power supply line L1 and the lines L11 and L12 have widths of several μm (for example, 2 to 9 μm). On the other hand, the lines L13 each have a width of several tens μm (for example, 50 μm or wider). Thus, the lines L13 (and thus the first subcontacts 130) each have a width equal to or wider than five times, and more preferably equal to or wider than ten times, the widths of the power supply line L1 and the lines L11 and L12.

Further, the reference current setting portion 2 and the power supply line L1 are adjacent to each other, and the power supply line L1 and the lines L13 (and thus the first subcontacts 130) are also adjacent to each other.

The lines L13 (and thus the first subcontacts 130) include a first portion (for example, a portion adjacent to the differential input stage 1Xa or 1Xb) a distance from which to the differential input stage 1Xa or 1Xb is shorter than a distance from the first portion to the amplification output stage 1Ya or 1Yb, and a second portion (for example, a portion adjacent to the amplification output stage 1Ya or 1Yb) a distance from which to the differential input stage 1Xa or 1Xb is longer than a distance from the second portion to the amplification output stage 1Ya or 1Yb, and, in plan view of the semiconductor chip 300, the first portion has a wider width than the second portion.

The power supply line L1 is laid so as to pass between the plurality of lines L13 (and thus the first subcontacts 130), and is connected to the differential input stage 1Xa and 1Xb.

The lines L13 (and thus the first subcontacts 130) are each arranged, in plan view of the semiconductor chip 300, so as to longitudinally or laterally cross a substantially central region of the element arrangement region A. The substantially central region mentioned just above means a region that is, in plan view of the semiconductor chip 300, away from two sides (the right side and the left side in FIG. 9) of the element arrangement region A that are substantially parallel to the direction in which the lines L13 are laid (the up-and-down direction of the sheet on which FIG. 9 is drawn) at least by a predetermined length (for example, a length equal to or longer than one-fifth of the entire length of the upper side or the lower side of the element arrangement region A).

Further, along the outer peripheral edge of the semiconductor chip 300, the line L14 is laid which forms the second subcontact 140. Accordingly, it is possible, for example, to have the second subcontact 140 absorb noise before the noise intrudes into the inside of the chip of the semiconductor 100.

Note that the line L14 does not necessarily need to be formed in a continuous endless shape; instead, for example, four straight lines L14 may be laid respectively along the four sides of the semiconductor chip 300. In that case, at four corners of the semiconductor chip 300, the lines L14 along the four sides may be laid out so as to engage with each other (see, for example, the upper-left corner 300a, a lower-left corner 300b, and a lower-right corner 300c of the semiconductor chip 300).

Figure 10:
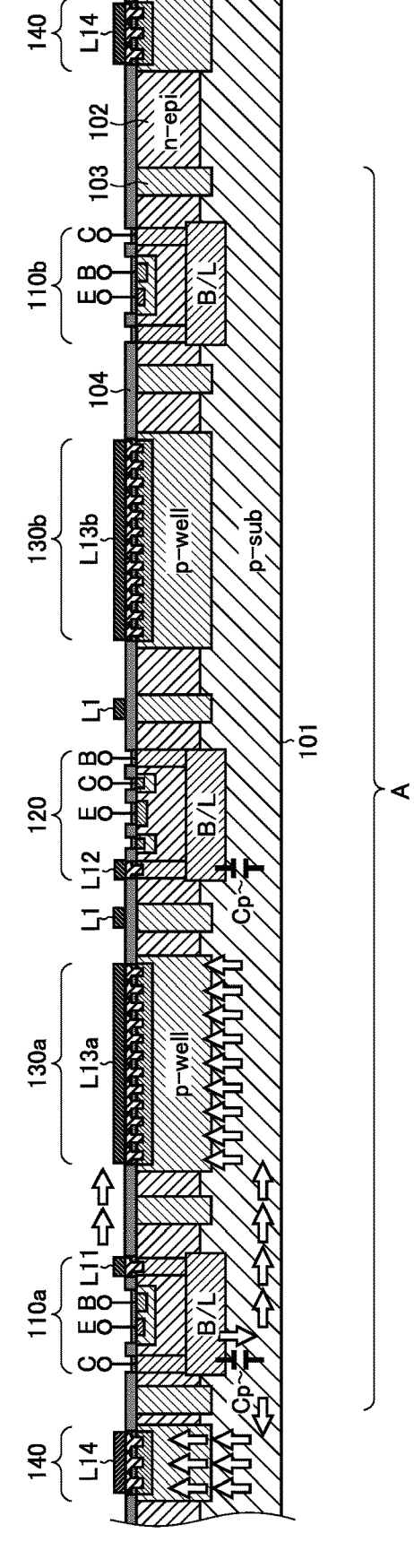
FIG. 10 is a schematic vertical sectional view taken along line α-β of FIG. 9.

FIG. 10 is a schematic vertical sectional view taken along line α-β of FIG. 9. The device structure shown in FIG. 10 is basically similar to that of the first embodiment (FIG. 2) described previously, and, as circuit elements that form the operational amplifiers 1a and 1b (in particular, the differential input stages 1Xa and 1Xb), the transistors 110a and 110b, respectively, are illustrated as examples. Further, as a circuit element that forms the reference current setting portion 2, the transistor 120 is illustrated as an example. Here, corresponding to FIG. 9 referred to previously, to the transistors 110a and 120, the lines L11 and L12 are connected, respectively.

Further, between the transistor 110a and the transistor 120 (and the power supply line L1), and between the transistor 110b and the transistor 120 (and the power supply line L1), the first subcontact 130a and the first subcontact 130b are disposed, respectively.

Accordingly, for example, noise that propagates from the transistor 110a via the p-type substrate 101 to the inside (the lower layer) of the semiconductor device 100 propagates to the first subcontact 130 without reaching the transistor 120, and is eventually let to escape from the line L13a toward the pad P4 (the ground pad). Further, noise that propagates over the surface (the upper layer) of the semiconductor device 100 is absorbed by the line L13a, as in the previously-described comparative example (FIG. 1).

Furthermore, in the semiconductor device 100, as a GND guard ring surrounding the element arrangement region A, the second subcontact 140 is arranged. Accordingly, it is possible to have the second subcontact 140 absorb noise before the noise intrudes into the inside of the semiconductor chip 300. These effects provided by this embodiment are basically similar to those provided by the first embodiment (FIG. 2) described previously.

FIG. 10, following FIG. 2 referred to previously, illustrates only the npn-type bipolar transistors 110a and 110b and the pnp-type bipolar transistor 120 as circuit elements formed in the element arrangement region A, but naturally, another circuit element such as an NMOSFET, a PMOSFET, or the like may also be formed.

Further, the choice of a circuit block in which noise interference should be avoided depends on the use and the field of the semiconductor device 100. Thus, it is important to appropriately position the first subcontacts 130.

Semiconductor Device (Fourth Embodiment)

Figure 11:
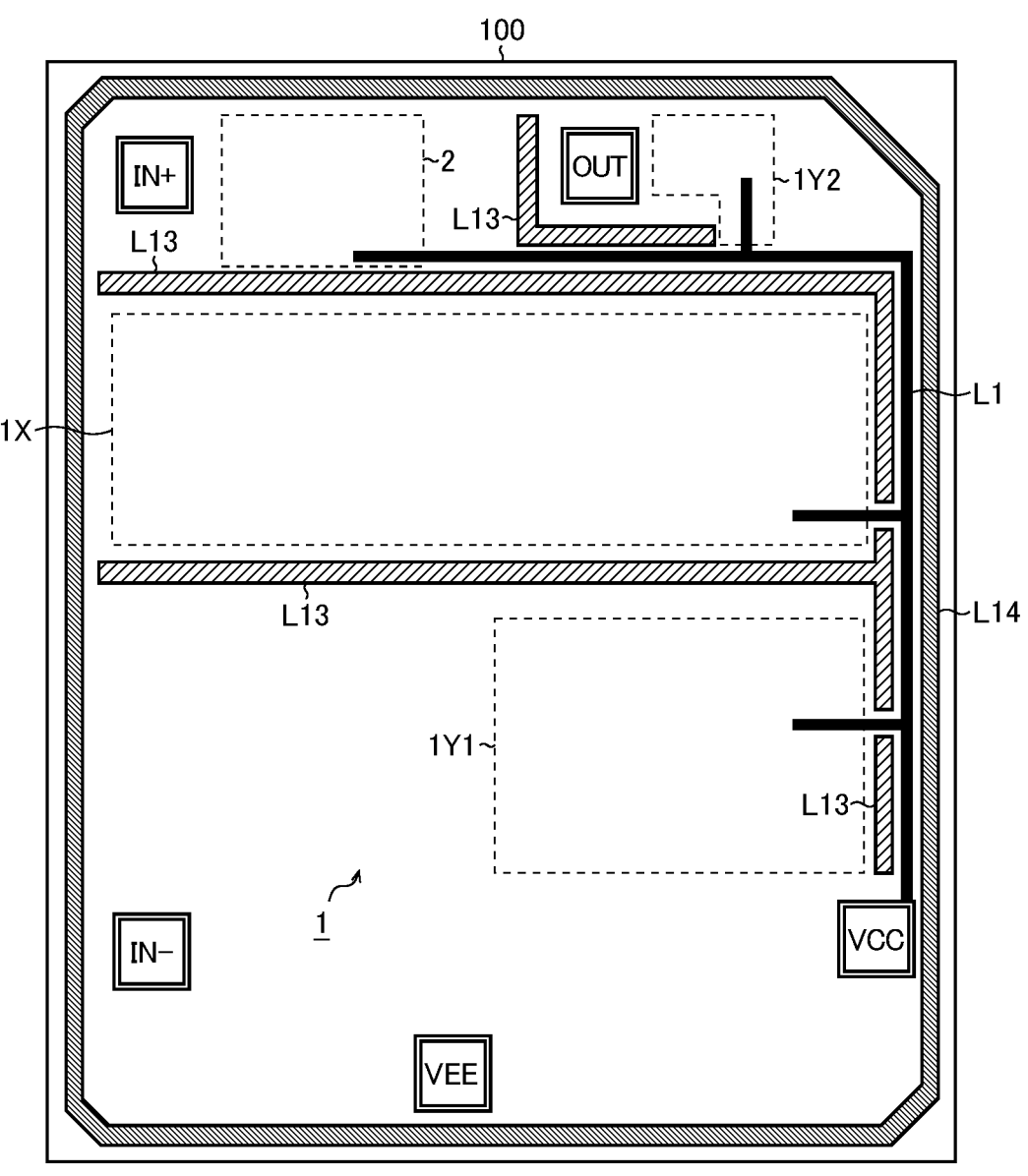
FIG. 11 is a diagram showing a semiconductor device according to a fourth embodiment.

FIG. 11 is a diagram showing a semiconductor device according to a fourth embodiment. A semiconductor device 100 according to this embodiment, like the one according to the second embodiment (FIG. 4), includes, integrated therein, one channel of the operational amplifier 1 (including the differential input stage 1X and the amplification output stage 1Y (in FIG. 11, an amplification stage 1Y1 and an output stage 1Y2 are separately illustrated) and the reference current setting portion 2. In this case, preferably, for example, the first subcontacts 130 (only the lines L13 are illustrated in FIG. 11) are arranged on opposite sides (upper and lower sides in FIG. 11) of the differential input stage 1X of the operational amplifier 1 such that the differential input stage 1X is disposed therebetween. Specifically, preferably, the lines L13 (and thus the first subcontacts 130) are arranged between the differential input stage 1X and the reference current setting portion 2 and between the differential input stage 1X and the amplification output stage 1Y (the amplification stage 1Y1 and the output stage 1Y2).

Further, preferably, at least part of the power supply line L1 is arranged between the differential input stage 1X and the amplification output stage 1Y.

Further, preferably, as shown in FIG. 11, the lines L13 are arranged between the differential input stage 1X and the power supply line L1, between the amplification output stage 1Y (the amplification stage 1Y1 and the output stage 1Y2) and the power supply line L1, and between the amplification output stage 1Y (in particular, the output stage 1Y2) and the reference current setting portion 2 or input pads (IN+, IN−).

Further, preferably, along the outer peripheral edge of the semiconductor device 100, the second subcontact 140 is arranged.

With this device structure, as has hitherto been described, it is possible to block the propagation of not only the noise propagating on the top surface (the upper layer) of the semiconductor device 100 but also the noise propagating in the inside (the lower layer) of the semiconductor device 100, and thus to effectively reduce noise interference in the operational amplifier 1.

<Noise Characteristics Evaluation>

Figure 12:
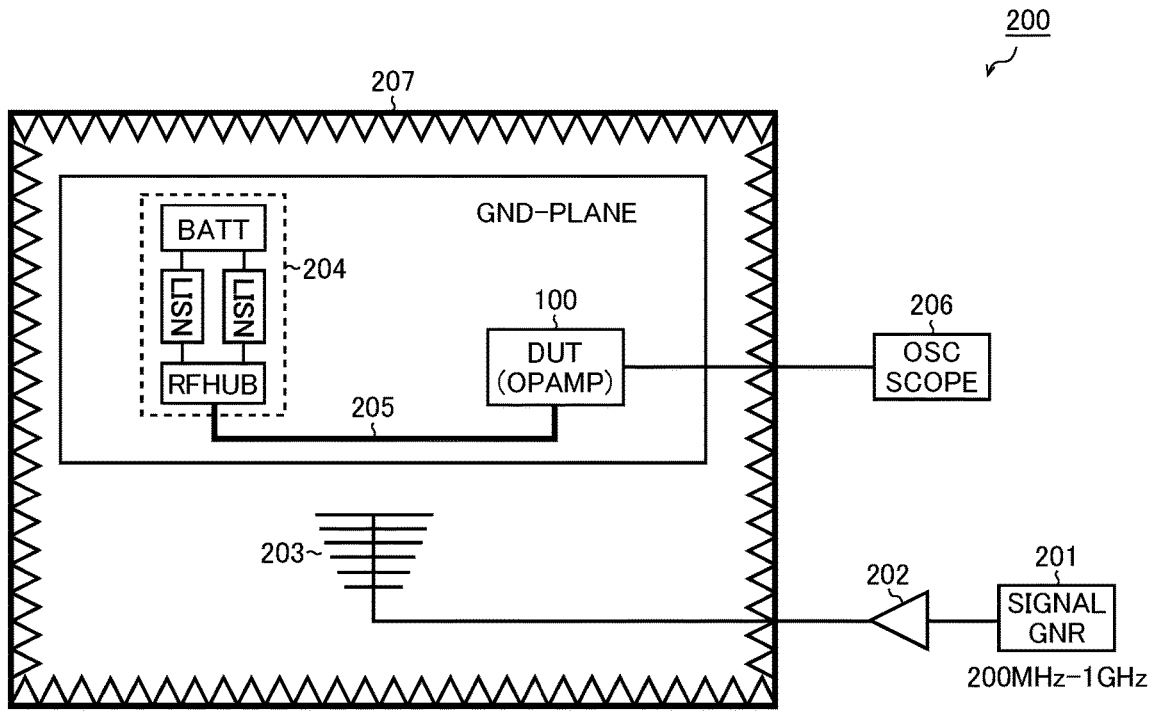
FIG. 12 is a diagram showing a measurement circuit used in a radio emission test.

FIG. 12 is a diagram showing a measurement circuit used in a radio emission test conducted with the semiconductor device 100 as a device under test (DUT). A measurement circuit 200 used in the radio emission test includes, besides the semiconductor device 100 as the DUT, a signal generator 201, an amplifier 202, an antenna 203, a pseudo power supply 204 (for example, VCC=12V), a wire harness 205, and an oscilloscope 206. Among these, the antenna 203, the pseudo power supply 204, the wire harness 250, and the semiconductor device 100 that serves as the DUT are all arranged in a radio-frequency anechoic chamber 207.

In the radio emission test conducted using the measurement circuit 200, a noise signal having a predetermined electric field strength (for example, 200 Vrms) is emitted from the antenna 203 toward a noise injection point of the wire harness 205. Here, the wire harness 205 has an entire length of 150 cm, and the distance from the noise injection point to the semiconductor device 100 is 75 cm. The distance from the antenna 203 to the noise injection point is 100 cm. These dimensions are based on ISO114522.

In the measurement circuit 200 described just above, with the wire harness 205 connected to the power supply terminal VCC of the semiconductor device 100, the noise signal is indirectly injected to the power supply terminal VCC of the semiconductor device 100. At that time, by serially reading output voltages appearing at the output terminal OUT (or the output terminal OUT1 or OUT2) of the semiconductor device 100 while sweeping the frequency of the noise signal within a predetermined range (for example, 200 MHz to 1 GHz), a plot of frequency vs output voltage can be obtained.

Figure 13:
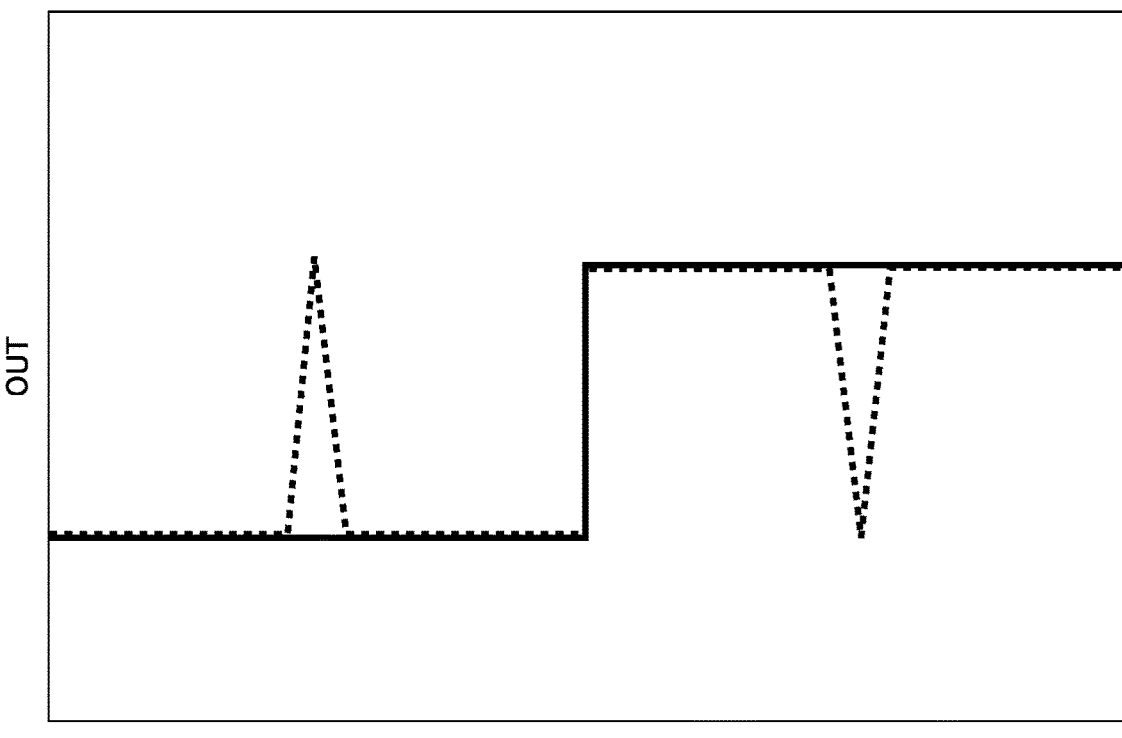
FIG. 13 is a diagram showing an example of the result of the radio emission test.

FIG. 13 is a diagram schematically showing an example of the result of the radio emission test. Here, the horizontal axis represents the frequency of the noise signal, and the vertical axis represents the output voltage of the semiconductor device 100.

A solid line in FIG. 13 indicates the result of the test conducted with the semiconductor devices 100 according to the first to fourth embodiments (see FIGS. 2 to 11) as the DUT, while a broken line indicates the result of the test conducted with the semiconductor device 100 according to the comparative example (see FIG. 1) as the DUT.

As is clear from FIG. 13, with the semiconductor devices 100 according to the first to fourth embodiments, it is possible to significantly lower the noise peak over the entire sweeping range of the frequency. Thus, the semiconductor devices 100 according to the first to fourth embodiments are excellent in noise characteristics (in particular, in electromagnetic susceptibility), and their outputs vary very little even when noise is fed thereto. This helps facilitate the provision of countermeasures against noise in a set in which the semiconductor device 100 is mounted, and thus excellent operability can be achieved.

<Application to Vehicle>

Figure 14:
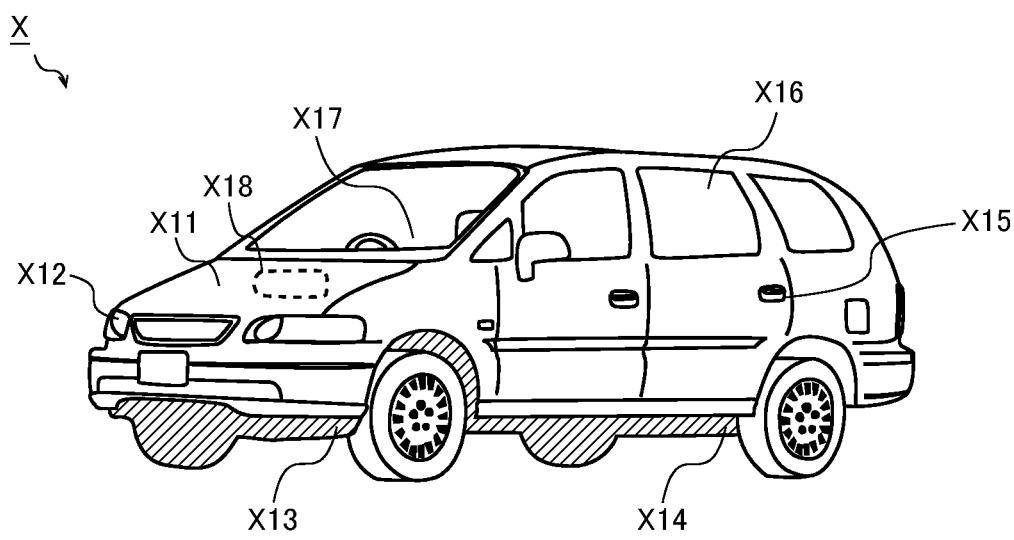
FIG. 14 is an exterior view of a vehicle.

FIG. 14 is an exterior view of a vehicle. A vehicle X in FIG. 14 has mounted therein various electronic apparatuses X11 to X18 that operate with power supplied from a battery.

Examples of the vehicle X include, besides an engine vehicle, an electric car (an xEV such as a battery electric vehicle (BEV), a hybrid electric vehicle (HEV), a plug-in hybrid electric vehicle/a plug-in hybrid vehicle (PHEV/PHV), a fuel cell electric vehicle/a fuel cell vehicle (FCEV/FCV), or the like).

Here, for convenience of illustration, mounting positions of the electronic apparatuses X11 to X18 in this figure may be different from their actual positions.

The electronic apparatus X11 is an electronic control unit that performs engine-related controls (injection control, electronic throttle control, idling control, oxygen sensor heater control, auto cruise control, etc.) or motor-related controls (torque control, power regeneration control, etc.).

The electronic apparatus X12 is a lamp control unit that performs lighting-on-and-off control of a high intensity discharged lamp (HID), a daytime running lamp (DRL), etc.

The electronic apparatus X13 is a transmission control unit that performs transmission-related control.

The electronic apparatus X14 is a braking unit that performs controls (anti-lock brake system (ABS) control, electric power steering (EPS) control, electronic suspension control, etc.) related to the motion of the vehicle X.

The electronic apparatus X15 is a security control unit that performs driving control of a door lock, a security alarm, etc.

The electronic apparatus X16 is an electronic apparatus incorporated in the vehicle X at the stage of shipment from the factory as standard equipment or as the manufacturer's option item, such as a wiper, a powered door mirror, a powered window, a damper (shock absorber), a powered sunroof, a powered seat, etc.

The electronic apparatus X17 is an electronic apparatus that is optionally mounted in the vehicle X as a user's option, such as an in-vehicle audio/visual (AN) device, a car navigation system, an electronic toll collection (ETC) system, etc.

The electronic apparatus X18 is an electronic apparatus that includes a high-withstanding-voltage motor, such as an in-vehicle blower, an oil pump, a water pump, a battery cooling fan, etc.

Note that the semiconductor device 100 described previously can be incorporated in any of the electronic apparatuses X11 to X18.

<Overview>

To follow is an overview of the various embodiments disclosed herein.

For example, a semiconductor device disclosed herein includes one or more first subcontacts electrically conducted to a substrate. Here, at least one of the one or more first subcontacts is formed in an element arrangement region of the substrate, and has a lower impedance than the substrate (a first configuration).

Preferably, in the semiconductor device having the above-described first configuration, at least one of the one or more first subcontacts is adjacent to a circuit element formed in the element arrangement region (a second configuration).

Preferably, in the semiconductor device having the above-described first or second configuration, on the substrate, which is of a first conductivity type, an epilayer of a second conductivity type is formed, and the one or more first subcontacts include a first line having a lower impedance than the substrate, and a semiconductor region of the first conductivity type penetrating through the epilayer to electrically conduct the first line and the substrate to each other (a third configuration).

Preferably, in the semiconductor device having the above-described third configuration, a second line is laid between a plurality of the first lines (a fourth configuration).

Preferably, in the semiconductor device having the above-described third or fourth configuration, the first line that is adjacent to a specific circuit element has a wider width than the first line that is not adjacent to the specific circuit element (a fifth configuration).

Preferably, in the semiconductor device having the above-described fifth configuration, the specific circuit element is a transistor forming a differential input stage (a sixth configuration).

Preferably, in the semiconductor device having any one of the above-described first to sixth configurations, at least one of the one or more first subcontacts is electrically conducted to a ground pad (a seventh configuration).

Preferably, in the semiconductor device having any one of the above-described first to seventh configurations, the one or more first subcontacts each have a width equal to or wider than a minimum width of a circuit element formed in the element arrangement region (an eighth configuration).

Preferably, the semiconductor device having any one of the above-described first to eighth configurations further includes a second subcontact formed so as to surround the element arrangement region (a ninth configuration).

Preferably, in the semiconductor device having any one of the above-described first to ninth configurations, an insulating layer covering an opening portion of a circuit element formed in the element arrangement region is thinner than an insulating layer covering other portions (a tenth configuration).

Preferably, in the semiconductor device having any one of the above-described first to tenth configurations, the one or more first subcontacts are disposed at least at one of the following positions: a position between a differential input stage of an operational amplifier and a power supply line; a position between an amplification output stage of the operational amplifier and the power supply line; and a position between an electrostatic protection element and the power supply line (an eleventh configuration).

Preferably, in the semiconductor device having the above-described eleventh configuration, at least part of the power supply line is disposed between the differential input stage and the amplification output stage (a twelfth configuration).

Preferably, in plan view of the semiconductor device having the above-described eleventh or twelfth configuration, the one or more first subcontacts each have a width equal to or wider than five times a width of the power supply line (a thirteenth configuration).

Preferably, in the semiconductor device having any one of the above-described eleventh to thirteenth configurations, a reference current setting portion configured to set a reference current of the operational amplifier is adjacent to the power supply line, and the power supply line is adjacent to the one or more first subcontacts (a fourteenth configuration).

Preferably, in the semiconductor device having any one of the above-described eleventh to fourteenth configurations, the one or more first subcontacts are disposed between the differential input stage and the amplification output stage (a fifteenth configuration).

Preferably, in the semiconductor device having any one of the above-described eleventh to fifteenth configurations, the one or more first subcontacts include a first portion a distance from which to the differential input stage is shorter than a distance from the first portion to the amplification output stage, and a second portion a distance from which to the differential input stage is longer than a distance from the second portion to the amplification output stage. Here, in plan view, the first portion has a wider width than the second portion (a sixteenth configuration).

Preferably, in the semiconductor device having any one of the above-described eleventh to sixteenth configurations, the power supply line is laid so as to pass between a plurality of the one or more first subcontact, and is connected to the differential input stage (a seventeenth configuration).

Preferably, in the semiconductor device having any one of the first to seventeenth configurations, the one or more first subcontacts are, in plan view, arranged at a substantially central region of the element arrangement region (an eighteenth configuration).

Preferably, in the semiconductor device having the above-described eighteenth configuration, the one or more first subcontacts are each arranged so as to cross the substantially central region of the element arrangement region longitudinally or laterally (a nineteenth configuration).

An electronic apparatus disclosed herein includes the semiconductor device having any one of the first to nineteenth configurations (a twentieth configuration).

<Further Modifications>

The embodiments discussed above have dealt with examples where an operational amplifier is used in an in-vehicle apparatus, but this is not intended to limit the application of the present invention, and the present invention is widely and generally applicable to any applications including household appliances, industrial apparatuses, etc.

Further, in addition to the above embodiments, it is possible to add various modifications to the various technical features disclosed herein without departing from the spirit of the technological creation. For example, bipolar and MOS field-effect transistors may be interchanged, and logic levels of various signals may be inverted as necessary. That is, it should be understood that the above embodiments are illustrative in all respects and are not intended to limit the present invention, that the technological scope of the present invention is not indicated by the above description of the embodiments but by the claims, and that all modifications within the scope of the claims and the meaning equivalent to the claims are covered.

INDUSTRIAL APPLICABILITY

The semiconductor devices (or the operational amplifiers) disclosed herein are usable in, for example, in-vehicle apparatuses, household appliances, or industrial apparatuses.

REFERENCE SIGNS LIST 1, 1a, 1b operational amplifier
1X, 1Xa, 1Xb differential input stage
1Y, 1Ya, 1Yb, 1Y1, 1Y2 amplification output stage
2 reference current setting portion
3 electrostatic protection element
100 semiconductor device
101 p-type substrate
102 n-type epilayer
103 p-type element isolation portion
104, 104x insulating layer
110, 110a, 110b npn-type bipolar transistor
111 n-type semiconductor region
112 n-type semiconductor region
113 p-type semiconductor region
114 n-type semiconductor region
115 p-type semiconductor region
116 conductive member 120 pnp-type bipolar transistor
121 n-type semiconductor region
122 n-type semiconductor region
123 p-type semiconductor region
124 p-type semiconductor region
125 p-type semiconductor region
126 conductive member
130, 130a, 130b first subcontact
131 p-type semiconductor region
132 p-type semiconductor region
133 conductive member
140 second subcontact
141 p-type semiconductor region
142 p-type semiconductor region
143 conductive member
200 measurement circuit (radio emission test)
201 signal generator
202 amplifier
203 antenna
204 pseudo power supply
205 wire harness
206 oscilloscope
207 radio-frequency anechoic chamber
300 semiconductor chip
300a to 300d upper-left corner, lower-left corner, lower-right corner, upper-right corner
310 island
320 mold resin
330, 340 support frame
A element arrangement region
C0, C1, C2 parasitic capacitor
C3 capacitor
Cp parasitic capacitor
D1, D2 electrostatic protection diode
I1 to I7 current source
L1 power supply line
L2 ground line
L3 reference current setting line
L4 output line
L11, L12, L13, L13a, L13b, L14 line
P1 to P8 pad
Q1 to Q6 pnp-type bipolar transistor
Q7 to Q13 npn-type bipolar transistor
R0 resistor (power supply resistor)
R1, R2 resistor (input resistor)
R3 resistor
W1 to W8 wire
X vehicle
X11 to X18 electronic apparatus

The invention claimed is:

1. A semiconductor device, comprising:
one or more first subcontacts electrically conducted to a substrate, wherein at least one of the one or more first subcontacts is formed in an element arrangement region on the substrate, and has a lower impedance than the substrate; and
an epilayer on the substrate, wherein the epilayer is of a second conductivity type and the substrate is of a first conductivity type that is different from the second conductivity type,
wherein the one or more first subcontacts include
a first line having a lower impedance than the substrate, and
a semiconductor region of the first conductivity type extending through the epilayer to electrically conduct the first line and the substrate to each other.

2. The semiconductor device according to claim 1, wherein at least one of the one or more first subcontacts is adjacent to a circuit element formed in the element arrangement region.

3. The semiconductor device according to claim 1, wherein a second line is laid between a plurality of the first lines.

4. The semiconductor device according to claim 1, wherein the first line that is adjacent to a specific circuit element has a wider width than the first line that is not adjacent to the specific circuit element.

5. The semiconductor device according to claim 4, wherein the specific circuit element is a transistor forming a differential input stage.

6. The semiconductor device according to claim 1, wherein at least one of the one or more first subcontacts is electrically conducted to a ground pad.

7. The semiconductor device according to claim 1, wherein the one or more first subcontacts each have a width equal to or wider than a minimum width of a circuit element formed in the element arrangement region.

8. The semiconductor device according to claim 1, further comprising a second subcontact formed so as to surround the element arrangement region.

9. The semiconductor device according to claim 1, wherein an insulating layer covering an opening portion of a circuit element formed in the element arrangement region is thinner than an insulating layer covering other portions.

10. The semiconductor device according to claim 1, wherein:
the one or more first subcontacts are disposed at at least one of the following positions:
a position between a differential input stage of an operational amplifier and a power supply line;
a position between an amplification output stage of the operational amplifier and the power supply line; or
a position between an electrostatic protection element and the power supply line.

11. The semiconductor device according to claim 10, wherein at least part of the power supply line is disposed between the differential input stage and the amplification output stage.

12. The semiconductor device according to claim 10, wherein, in plan view, the one or more first subcontacts each have a width equal to or wider than five times a width of the power supply line.

13. The semiconductor device according to claim 10, wherein a reference current setting portion configured to set a reference current of the operational amplifier is adjacent to the power supply line, and the power supply line is adjacent to the one or more first subcontacts.

14. The semiconductor device according to claim 10, wherein the one or more first subcontacts are disposed between the differential input stage and the amplification output stage.

15. The semiconductor device according to claim 10, wherein:
the one or more first subcontacts include:
a first portion a distance from which to the differential input stage is shorter than a distance from the first portion to the amplification output stage, and
a second portion a distance from which to the differential input stage is longer than a distance from the second portion to the amplification output stage, and
in plan view, the first portion has a wider width than the second portion.

16. The semiconductor device according to claim 10, wherein the power supply line is laid so as to pass between a plurality of the one or more first subcontact, and is connected to the differential input stage.

17. The semiconductor device according to claim 1, wherein the one or more first subcontacts are, in plan view, arranged in a substantially central region of the element arrangement region.

18. An electronic apparatus, comprising the semiconductor device according to claim 1.

19. A semiconductor device, comprising:
one or more first subcontacts electrically conducted to a substrate, wherein at least one of the one or more first subcontacts is formed in an element arrangement region on the substrate, and has a lower impedance than the substrate, and
wherein at least one of the one or more first subcontacts is electrically conducted to a ground pad.

20. A semiconductor device, comprising:
one or more first subcontacts electrically conducted to a substrate, wherein at least one of the one or more first subcontacts is formed in an element arrangement region on the substrate, and has a lower impedance than the substrate, and
wherein an insulating layer covering an opening portion of a circuit element formed in the element arrangement region is thinner than an insulating layer covering other portions.

* * * * *